United States Patent [19]

Hayden

[11] Patent Number: 4,662,811

[45] Date of Patent: May 5, 1987

[54] METHOD AND APPARATUS FOR ORIENTING SEMICONDUCTOR WAFERS

[76] Inventor: Thomas J. Hayden, 2244 Mesa Verde Dr., Milpitas, Calif. 95035

[21] Appl. No.: 516,680

[22] Filed: Jul. 25, 1983

[51] Int. Cl.[4] ............................................. B65G 47/24
[52] U.S. Cl. ..................................... 414/433; 414/757; 414/786; 198/394
[58] Field of Search ............... 414/433, 754, 757, 787, 414/786; 198/394

[56] References Cited

U.S. PATENT DOCUMENTS

| | | | |
|---|---|---|---|
| 3,297,134 | 1/1967 | Pastuszak | 198/394 X |
| 3,865,254 | 2/1975 | Johannsmeier | 414/676 |
| 3,901,183 | 8/1975 | Wittkower | 414/217 X |
| 3,982,627 | 9/1976 | Isohata | 198/394 X |
| 3,997,065 | 12/1976 | Jaksch | 414/757 X |
| 4,311,427 | 1/1982 | Coad et al. | 414/217 |
| 4,376,482 | 3/1983 | Wheeler et al. | 198/394 |
| 4,441,853 | 4/1984 | Kosugi | 414/757 |
| 4,449,885 | 5/1984 | Hertel et al. | 198/345 X |

FOREIGN PATENT DOCUMENTS 99738 7/1980 Japan ................................. 414/287

OTHER PUBLICATIONS

"Semiconductor Wafer Alignment Fixture", from IBM Technical Disclosure Bulletin, vol. 10, No. 6, p. 828, Nov. 1967.

*Primary Examiner*—Robert J. Spar
*Assistant Examiner*—Stuart J. Millman
*Attorney, Agent, or Firm*—Limbach, Limbach & Sutton

[57] ABSTRACT

A method and apparatus for orienting semiconductor wafers of the type that have a generally circular peripheral shape and a flat, chordally extending edge on the periphery. In fabricating the wafers the chordally extending portion is formed in fixed relation to the crysatallographic axes of the material of which the wafer is formed. All subsequent processes are precisely orientated with respect to the chordally extending edge and the present invention affords orientation of such edge to virtually any position.

7 Claims, 29 Drawing Figures

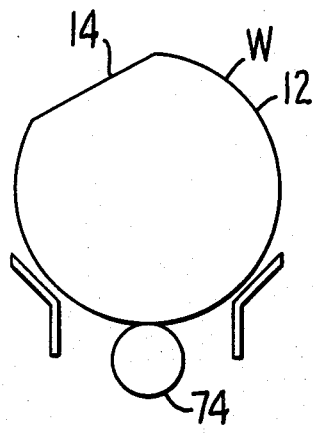
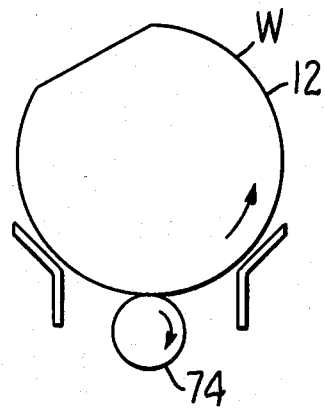
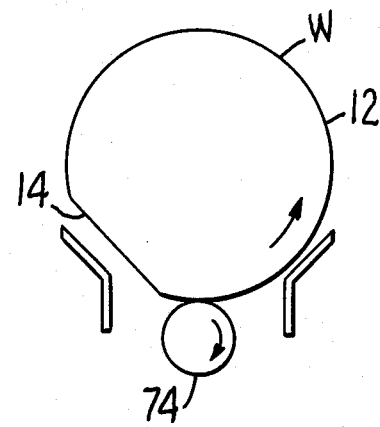
FIG.3A.   FIG.3B.   FIG.3C.
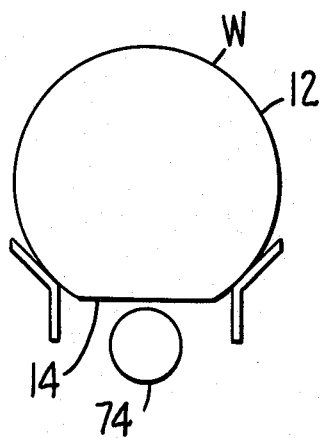
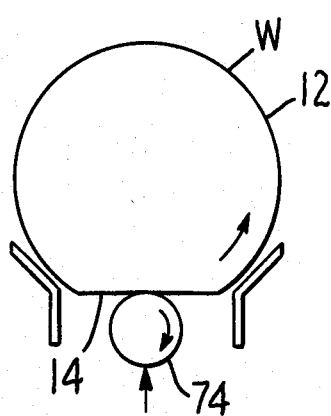
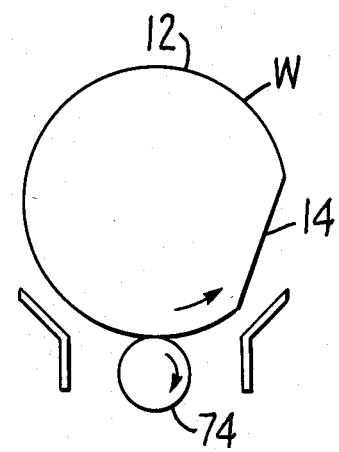
FIG.3D.   FIG.3E.   FIG.3F.
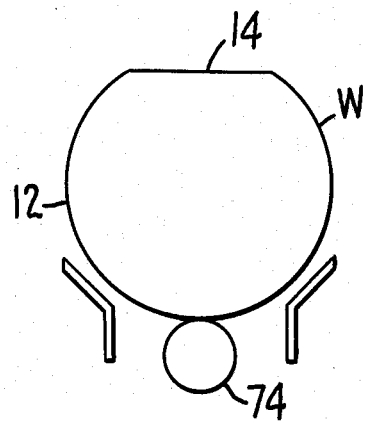
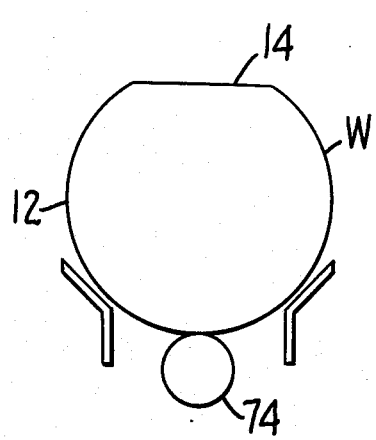
FIG.3G.   FIG.3H.

METHOD AND APPARATUS FOR ORIENTING SEMICONDUCTOR WAFERS

BACKGROUND OF THE INVENTION

1. Field of the Invention

This invention relates to an apparatus and method for orienting semiconductor wafers and more particularly to orienting a plurality of such wafers so that the flat sides of the wafers lie in a common plane.

2. Description of the Prior Art

In manufacturing integrated circuits a boule of semiconductor material, such as silicon, is grown and thereafter the boule is cut into slices. The surfaces of the slices are polished to a high degree of flatness and then a chordally extending flat edge portion is formed on the periphery of each slice or wafer, the flat side typically bearing a predetermined relationship to a crystallographic axis of the material of which the wafer is formed. Throughout further processing of a wafer the flat edge portion is employed as a reference in order that the position and orientation of subsequence operations will be as desired.

It is typical to transport a plurality of wafers between various operating stations in a tray. A typical wafer tray include a pair of sidewalls that are supported in rigid spaced apart relation to one another. The sidewalls have a plurality of protruding ribs between each adjacent pair of which is formed a slot for receiving a single wafer. A typical wafer tray has 25 such slots and thus is capable of supporting 25 wafers. The typical tray has a truncated or open lower portion so that access can be had to the peripheral edges of the wafers. Processing the wafers usually requires removal of the wafers from the tray; processing is expedited and facilitated if the flat edge portions of all wafers in a tray are positioned in a common plane at or near either the top of the tray or the bottom of the tray.

A wafer tray of the type referred to above is shown in IBM Technical Disclosure Bulletin, vol. 10, No. 6, November 1967, page 828 in an article entitled "Semiconductor Wafer Alignment Fixture" by Delgado. The apparatus shown in such bulletin operates on wafers that have a semicircular cutout to orient all wafers with the semicircular cutout at the bottom of the wafer tray.

Other known prior art operates on wafers singly; such prior art is described in the following U.S. Pat. Nos. 3,297,134; 3,982,267; and 3,997,065.

SUMMARY OF THE INVENTION

The present invention orients wafers disposed in a wafer tray by contacting the portion of the wafer periphery that is accessible at the bottom of a typical wafer tray. The contact is made by a roller which has a friction surface, i.e., a surface adapted to engage the peripheral edge of a wafer and impart rotational movement to the wafer in response to rotation of the roller. The friction surface has a portion that is cylindrical with respect to the axis and rotation of the friction surface with respect to the axis effects corresponding rotation of the wafers.

In one form of the invention the entire friction surface is cylindrical and is formed on a roller. The roller is rotated in a first phase of operation until all of the flat edge portions confront the roller in a flat-side down position. At such position the flat edges are spaced from the roller because the radial extent of the flat edges is less than that of the circular portion of the wafer periphery. The axis of rotation of the roller is then translated upward so that contact with the flat edges of all wafers is made. The roller is then driven a prescribed rotational amount in a second phase until the flat edges of all wafers are at or near the top of the wafer tray. At this position the wafers can be conveniently removed from the wafer tray in a known or predetermined orientation so that further processing on the wafer is expedited and facilitated.

In another form of the invention there is a roller having a friction surface that has a cylindrical part and a cam-like protruding part. The circumferential length of the cylindrical part of the roller is at least as long as the circumference of the wafer. In this form of the invention it is not necessary to translate the roller upward because during first phase the cylindrical part of the roller contacts the periphery of the wafer and rotates all wafers into a flat edge down position. Further rotation of the roller brings the protruding cam-like portion into contact with the flat edges of the wafers and further rotation of a controlled amount brings the wafers into a flat edge up position.

An object of the invention is to provide a method and apparatus for quickly and accurately orienting wafers in a wafer tray so that the flat edges of all wafers reside in a common plane. This object is achieved by contacting the wafer peripheries with a friction surface and by rotating the surface through a first phase at which the side edges are moved to a flat edge down position and a second phase in which the wafers are rotated to a flat edge up position.

A feature and advantage of the invention is that further processing of the wafers can be expedited or automated if all wafers are precisely oriented in a flat edge up position.

The foregoing, together with other objects, features, and advantages, will be more apparent after referring to the following specification and the accompanying drawings

BRIEF DESCRIPTION OF THE DRAWINGS

FIGS. 3A–3H are schematic views of the apparatus during various points in the rotation of the roller and the wafer.

FIGS. 7A–7M are schematic views showing the operation of the embodiment of FIG. 6 at various points in the rotation of the roller and the wafer.

DESCRIPTION OF THE PREFERRED EMBODIMENT

Figure 1:
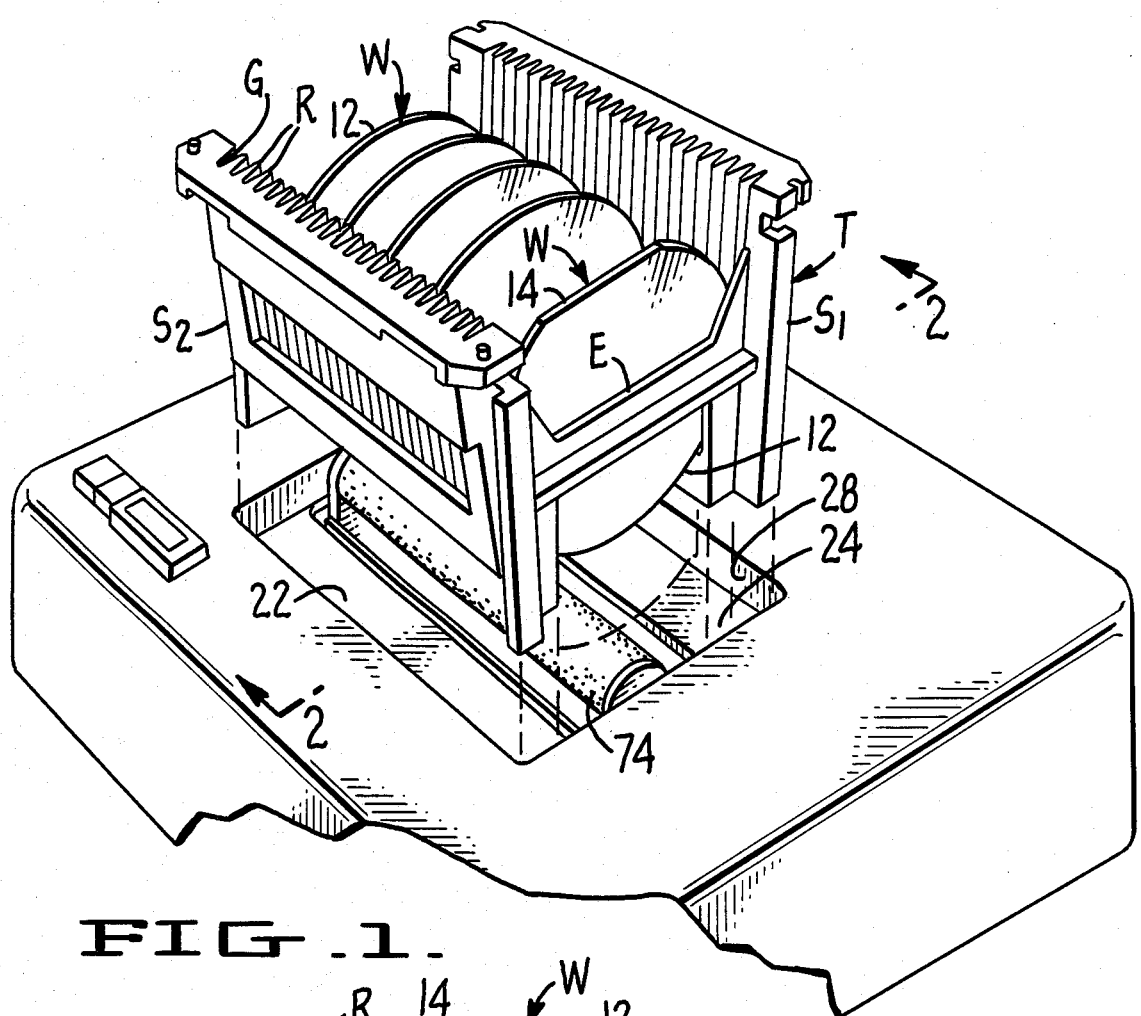
FIG. 1 is a perspective view of a typical wafer tray with which the method and apparatus of the invention are particularly useful.

Referring more particularly to the drawings, reference character T indicates a wafer tray of conventional form which is adapted to support a plurality of semiconductor wafers W. Tray T has a pair of upstanding side walls $S_1$ and $S_2$ which are supported in fixed relation to one another by end walls, one of which is seen in FIG. 1 at E. The inner surfaces of side walls $S_1$ and $S_2$ define a plurality of spaced apart ribs R between adjacent pairs of which are formed slots or grooves G which are dimensioned to receive the margins of wafers W. The dimensions of the slots or grooves G are established such that wafers W are supported in tray T in spaced apart relation and are loosely supported so that they can freely move within the respective slots. As seen in FIG. 1, end wall E is truncated at the lower portion thereof so as to afford access to the peripheries of the wafers supported in tray T.

Figure 2:
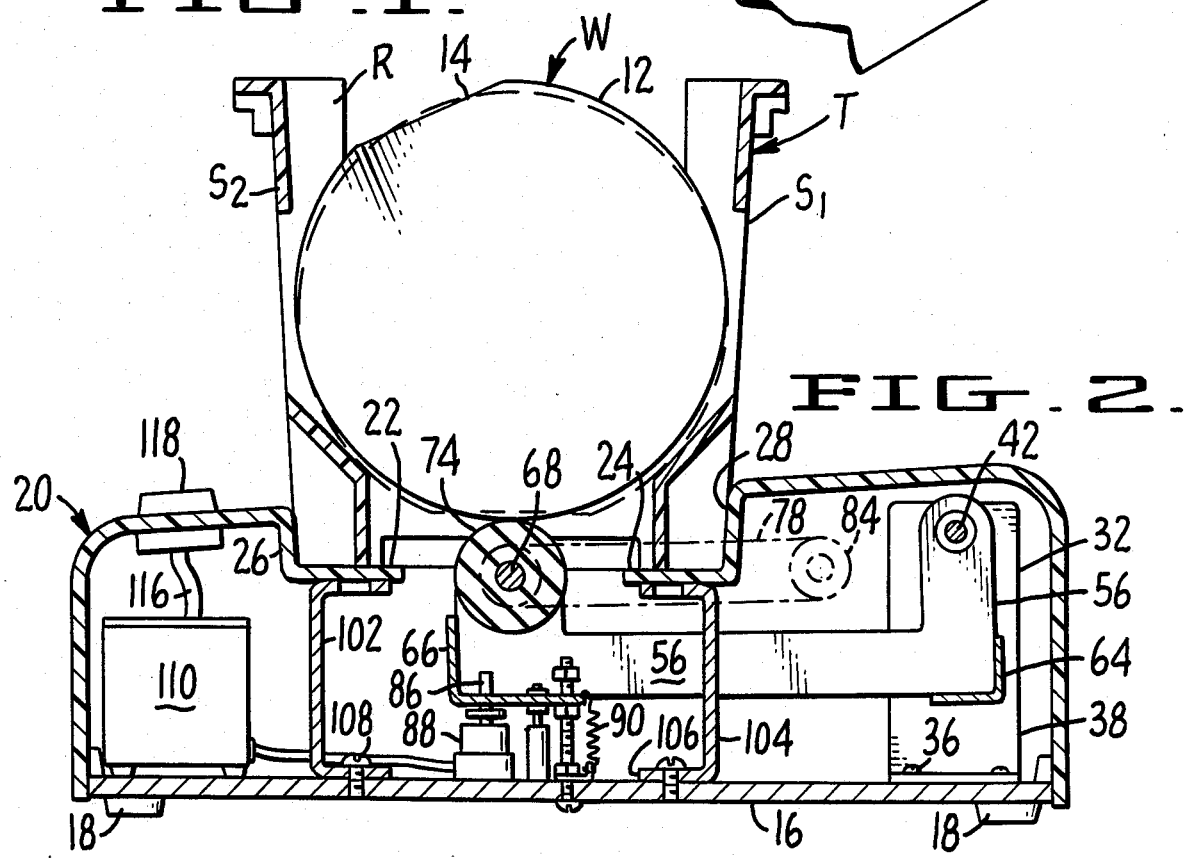
FIG. 2 is an elevation view in cross section of one form of orienting apparatus according to the invention.
Figure 2A:
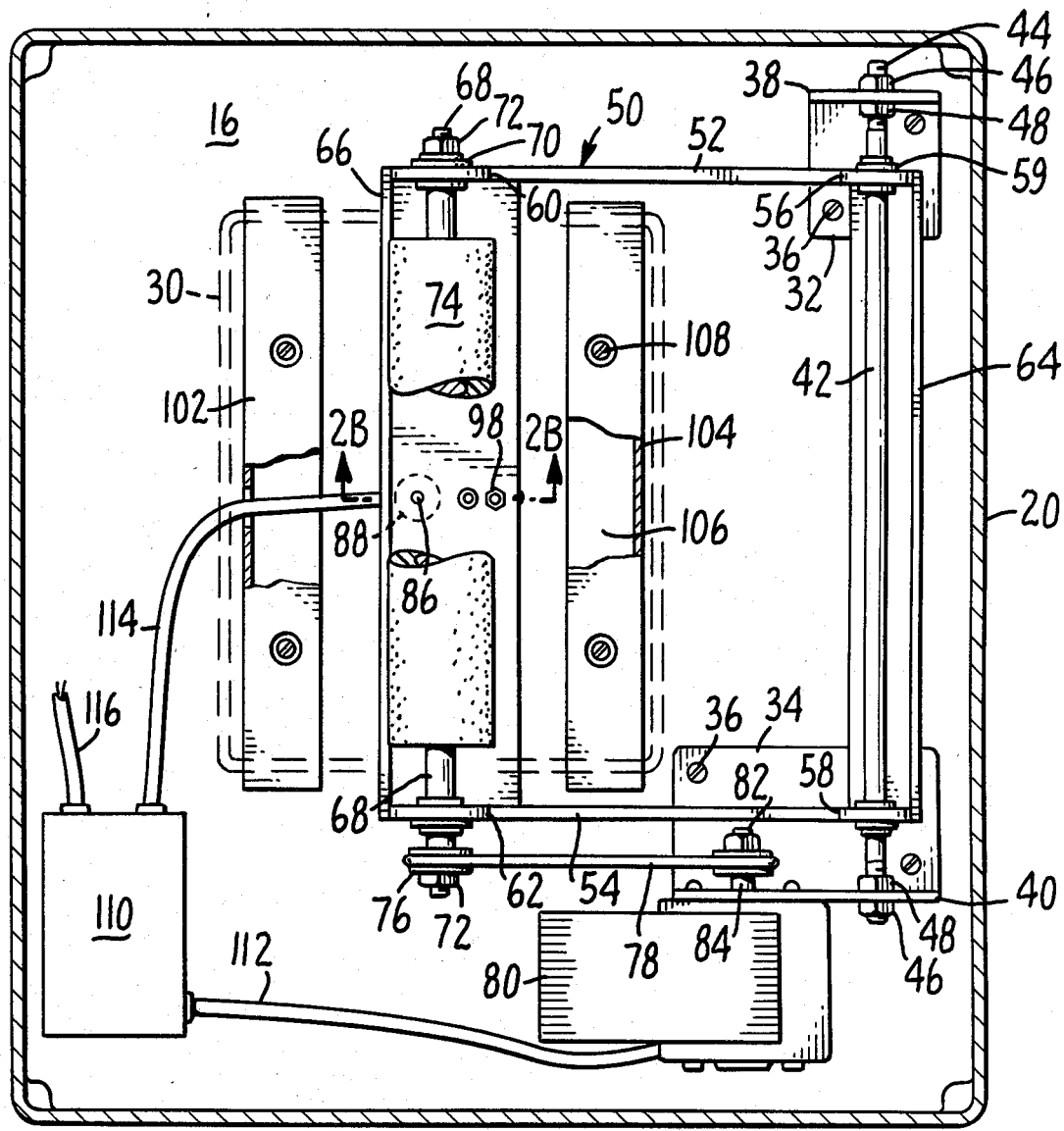
FIG. 2A is a plan view of the apparatus of FIG. 2.
Figure 2B:
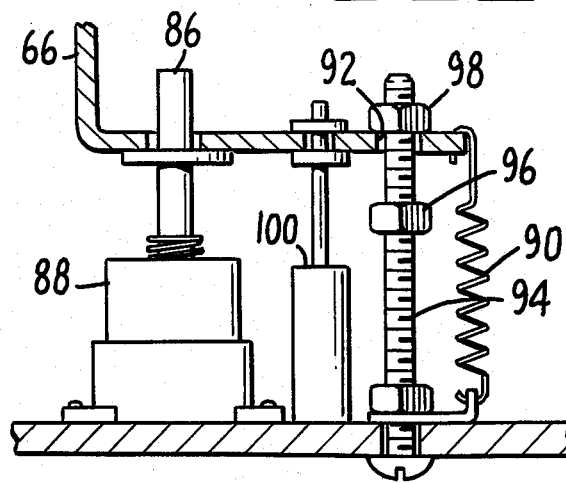
FIG. 2B is a fragmentary cross-sectional view taken along line 2B—2B of FIG. 2A.

Wafers W are of generally circular shape and have a circular edge portion 12 and a flat portion 14 which extends chordally of the circular portion. Early in the manufacturing process, flat side 14 is formed at a predetermined orientation to one of the crystallographic axes of the material of which wafer is made; the flat edge is employed in subsequent processing steps for orienting the wafer with respect to such crystallographic axis. One form of apparatus for orienting all wafers within tray T so that the flat edges 14 are oriented in a common plane is shown in FIGS. 2, 2A, and 2B.

The apparatus has a rigid base plate 16 which is provided with depending padded feet 18 so that the apparatus can be supported on a table or bench. There is a rigid imperforate housing 20 which is removably attached to base plate 16 to afford access to the mechanism mounted to the base plate. Housing 20 includes coplanar horizontal walls 22 and 24 which form a platform for supporting wafer tray T. Adjacent to horizontal walls 22 and 24 are vertical walls 26 and 28 respectively which are spaced from one another by a distance corresponding to the width of wafer tray T so that the wafer tray is supported in a fixed position on the apparatus. In FIG. 2A the limits of the platform on which wafer tray T is supported are represented by phantom lines 30.

Secured to base plate 16 remote from the platform are L-shaped brackets 32 and 34. Each of the brackets has a horizontal plate that is secured to the base plate by screws 36. Bracket 32 has a vertical plate 38, and bracket 34 has a vertical plate 40. The vertical plates 38 and 40 define aligned holes through which the ends of a pivot shaft 42 extend. The ends of the pivot shaft are threaded as indicated at 44, and there are nuts 46 and 48 which fix the shaft to vertical plates 38 and 40.

Supported on pivot shaft 42 for pivotal movement with respect thereto is a pivot arm assembly in the form of a generally rectangular frame 50. The frame is formed of two substantially identical rigid side members 52 and 54 which have upstanding arms 56 and 58 at one extremity. The upstanding arms are formed with aligned bores in which bearings 59 are installed, the bearings having an inner diameter corresponding to the outer diameter of pivot shaft 42 so that frame 50 can freely pivot with respect to the axis of pivot shaft 42. At the opposite extremities of members 52 and 54 are similar upstanding arms 60 and 62. Spanning opposite ends of members 52 and 54 and fixed thereto such as by welding are angles 64 and 66. The angles have vertical and horizontal webs so that their attachment to the oppsite ends of members 52 and 54 provide a rigid frame.

Upstanding arms 60 and 62 define aligned bores in which a shaft 68 is rotatively supported, there being bearings 70 which support shaft 68 for free rotation with respect to frame 50. Shaft 68 has threaded portions at opposite ends thereof with which nuts 72 are ingaged to retain the shaft on frame 50. Supported on shaft 68 at the portion thereof between upstanding arms 60 and 62 is a roller 74. Roller 74 has a cylindrical surface formed of elastomeric material, such as 50–55 Duro White Nitrile, so as to afford friction, driving contact between the roller surface and the peripheries of the silicon wafers W. Adjacent to side member 54 a pulley or sheave 76 is fixed to shaft 68. The sheave supports one end of a drive belt 78. Secured to vertical plate 40 of bracket 34 is a motor 80. The motor has a shaft 82 on which a pulley or sheave 84 is mounted. The end of drive belt 78 opposite from sheave 76 is engaged with sheave 84. Activation of motor 80 rotates shaft 82, in response to which shaft 68 and roller 74 rotate about the central axes thereof. Drive belt 78 has a sufficient degree of elasticity to afford a driving connection between sheaves 84 and 76 in all pivotal positions of frame 50 about the axis of shaft 42. To the horizontal web of angle 66 an actuator 86 is fixed, the actuator being a part of solenoid 88 which when energized pivots frame 50 upward about pivot shaft 42.

There is a tension spring 90 that has a lower end attached to base plate 16 and an upper end attached to the horizontal web of angle 66. When solenoid 88 is energized to move angle 66 and frame 50 upward, energy is stored in spring 90; when the solenoid is deenergized, the stored energy causes frame 50 to pivot downward. For limiting the upper and lower extremes of pivotal movement of frame 50, the horizontal web of angle 66 is formed with a clearance hole 92. Attached to base plate 16 and extending upward therefrom is a screw 94. Engaged with screw 94 below the horizontal plate of angle 66 is a lower adjusting nut 96, and above the horizontal plate is an upper adjusting nut 98. Thus the position of nuts 96 and 98 along screw 94 determines the lower and upper extremity of pivotal movement of frame 50 and the excursion of roller 74. Because the pivotal movement to the frame caused by solenoid 88 is rather abrupt, there is a shock absorber or damper 100 having a lower end connected to base plate 16 and an upper end connected to the horizontal web of angle 66. Damper 100 assures that pivotal movement of the frame is relatively slow so as not to subject wafers W to undue impact or vibration.

Mounted to base plate 16 on opposite sides of roller 74 and in parallel with the roller are spacers 102 and 104. The spacers are of generally C-shaped cross section and have lower horizontal webs, one of which is seen at 106, which are drilled to receive mounting screws 108 to fasten the spacers to base plate 16. The purpose of the spacers is to assure that wafer tray T is supported in fixed relation to the balance of the mechanism even though housing 20 may be deformed.

Secured to base plate 16 is a circuit module to which is connected a cable 112 to motor 80, a cable 114 to solenoid 88, and a cable 116 to operator controls 118 which are mounted to housing 20 and accessible from the exterior of the housing. The circuit module includes conventional elements, such as relays and timers, for controlling the sequence of actuation of motor 80 and solenoid 88.

In operation, lower adjusting nut 96 is positioned so that roller 66 resides in the position shown in FIGS. 2 and 3A when solenoid 88 is de-energized. In such position when tray T is placed on the platform formed by horizontal walls 22 and 24, the cylindrical surface of the roller is in frictional contact with circular peripheral portions 12 of wafers W disposed in the tray but is spaced apart from chordally extending flat edges 14 (see FIG. 3A). In such condition, motor 80 is energized to rotate roller 74 in a clockwise direction as indicated in FIGS. 3B et seq. Because of the frictional contact between the cylindrical surface of the roller and the peripheral edge of wafer W, the wafer experiences rotation in a counterclockwise direction within tray T. Such rotation continues, as indicated in FIG. 3C, until chordally extending flat edge 14 reaches the position seen in FIG. 3D. At that position, chordally extending edge 14 resides in spaced apart relation to the cylindrical surface of roller 74 and no further rotative motion is imparted to the wafer. In response to continued rotation of roller 74, all wafers eventually reach the position seen in FIG. 3D, and the chordally extending edges 14 of all wafers reside in a common plane at which the edges confront the friction surface of roller 74 in spaced apart relation to the friction surface. If the user wishes the wafers in tray T to be in a flat side down position, machine operation is terminated and the tray is removed.

If the user wishes the wafers to be in a flat side up position, solenoid 88 is energized to translate roller 74 upward by pivoting frame 50 about the axis of pivot shaft 42. This moves roller 74 to the position shown in FIG. 3E at which the roller contacts the chordally extending flat edge of the wafer. The upward movement of frame 50 also stores energy in spring 94. Thus continued rotation of roller 74 results in corresponding rotation to wafer W as depicted in FIG. 3F. Because chordally extending edges 14 of all wafers are in a common plane when the roller is translated upward into contact with the flat edges, the flat edges remain in the coplanar relationship as the wafers are rotated in unison by rotation of roller 74. Rotation of roller 74 is continued until the chordwally extending flat edges 14 reach the position shown in FIG. 3G at which the flat edges reside at the top of the wafer tray and are circumferentially spaced from the roller surface by about 180°. A cycle is complete, and the wafers reside in a flat side up position. At this position motor 80 is de-energized. Solenoid 88 is also de-energized, and the energy stored in spring 94 causes roller 74 to be translated downward as frame 50 experiences corresponding pivotal movement. The final position is shown in FIG. 3H. In such position tray T can be removed from the apparatus and the flat edges of all wafers are in an upward position so that subsequent processing steps on the wafers can be carried out with more efficiency.

Figure 4:
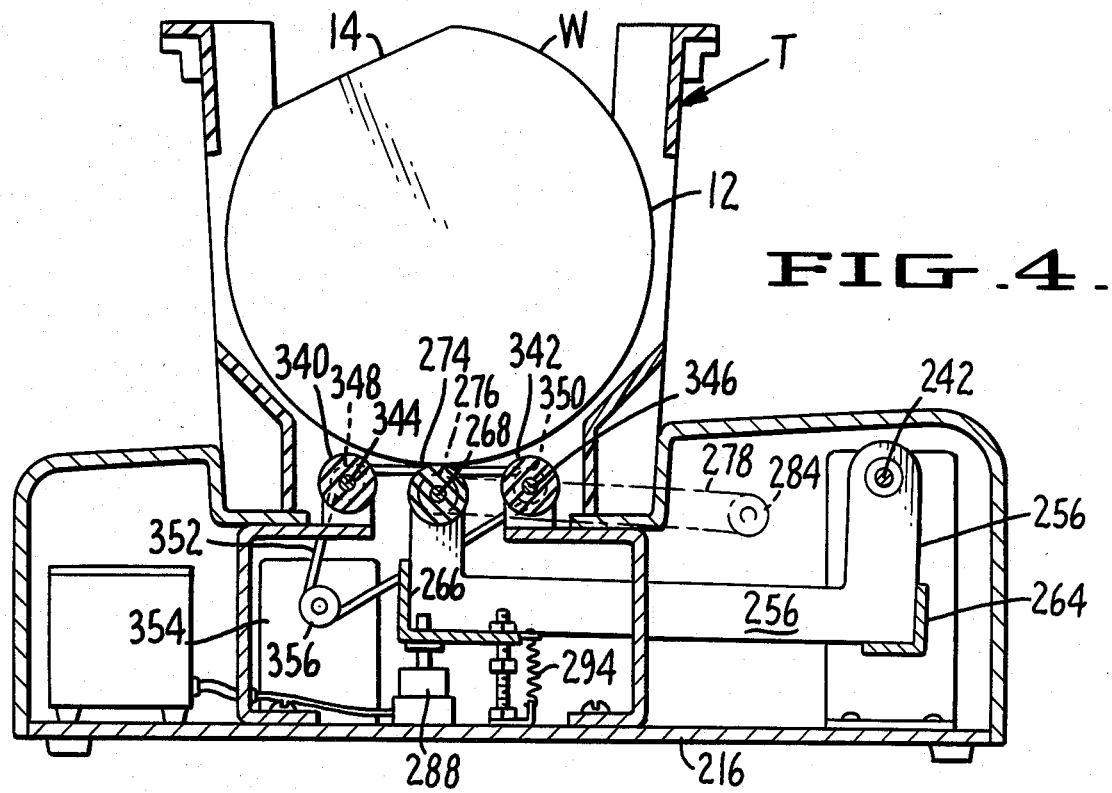
FIG. 4 is a cross-sectional view similar to FIGS. 2 showing an alternate embodiment of the invention.

Because the embodiment of FIG. 4 has many structural elements identical to those previously described in connection with FIGS. 2 and 2A, reference numerals greater by 200 than those employed in FIGS. 2 and 2A are used in FIG. 4 to identify corresponding parts. More particularly, there is a pivot shaft 242 which supports a generally rectangular frame formed by a rigid side member 256, a second rigid side member (not shown) identical thereto, and angle members 264 and 266. An upstanding member 256 has a bushing for pivotally supporting the frame on pivot shaft 242 and the opposite end of the frame includes an upstanding leg 260 which supports a shaft 268 an which a roller 274 is mounted. Roller 274 has a friction surface so that it can frictionally engage the peripheral edge of wafer W. Mounted on shaft 268 is a sheave 276 around which is trained one end of a drive belt 278. The opposite end of the drive belt is trained around a motor pulley 284 powered by a motor driven shaft 282, shaft 282 is driven by a motor (not shown) that is equivlent to that identified by reference numeral 80 in FIG. 1.

Supported for rotation on opposite sides of roller 274 on fixed axes are rollers 340 and 342, shafts 344 and 346 being provided to support the respective rollers. Rollers 340 and 342 have friction surfaces so that when the wafer peripheries contact the roller surfaces while the rollers are rotating, the wafers will correspondingly rotate. Bearing supports (not shown) are secured to base plate 216 for supporting shafts 344 and 346 for rotation about fixed horizontal axes that are parallel to and flank the axis of shaft 268. There are sheaves 348 and 350 fixed to the respective shafts, and a drive belt 352 is trained around the sheaves. A motor 354 drives a motor sheave 356 around which drive belt 352 is trained so that when the motor sheave is rotatively driven by motor 354, rollers 340 and 342 are rotatively driven about their axes. The embodiment of FIG. 4 also includes a solenoid 288, which operates similar to solenoid 88 described previously in connection with FIGS. 2-2B, to translate roller 274 toward and away from the periphery of wafer W. The motor and solenoid control elements and the tray support structure are provided in the embodiment of FIG. 4, but those elements are not described in detail because they are substantially identical to corresponding elements previously described in connection with FIGS. 2-2B.

Figure 5A:
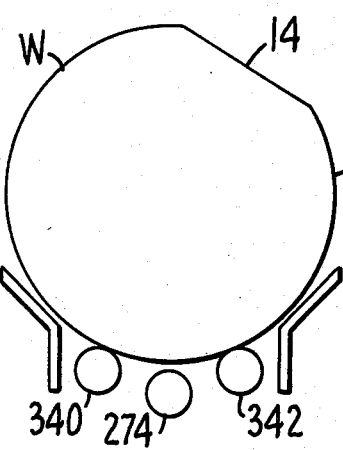
FIGS. 5A–5F are schematic views showing the operation of the embodiment of FIG. 4 at various points in the rotation of the roller and the wafer.
Figure 5B:
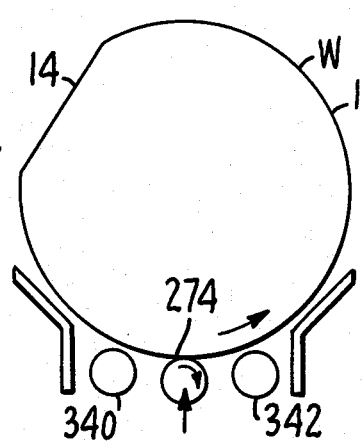
Figure 5C:
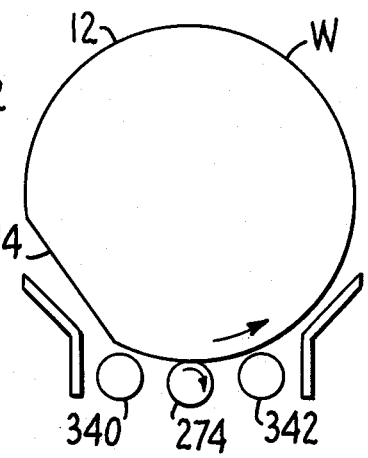

The operation of the embodiment of FIG. 4 will be described in connection with FIGS. 5A-5G. With the apparatus in a quiescent state, with the motors and the solenoid de-energized, the tray T is loaded onto the platform so that the wafers assume the position shown in FIG. 5A. At this point flat edges 14 of the wafers are oriented in random fashion. To commence the orientation procedure, solenoid 288 is energized and the motor that drives shaft 282 is energized so as to effect rotation of roller 276. An upper adjusting nut (not shown in FIG. 4) is adjusted so that when solenoid 288 is energized, wafers W are raised out of contact with the surfaces of rollers 340 and 342. Thus as seen in FIG. 5B, the cylindrical surface of roller 274 frictionally engages the periphery of wafers W and causes rotation of the wafers within the tray. An intermediate stage of such rotation is seen in FIG. 5C. Rotation of the wafers continues until all wafers reach the position shown in FIG. 5D. In such position the flat edges 14 are supported in spaced apart relation to the surface of roller 274 because the wafers are supported by contact between flat edge 14 and the surface of roller 340 and contact between a portion of the circular periphery of wafer W and roller 342.

Figure 5D:
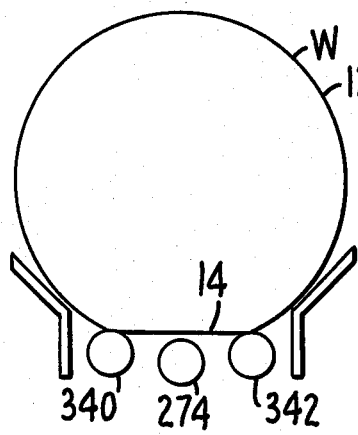
Figure 5E:
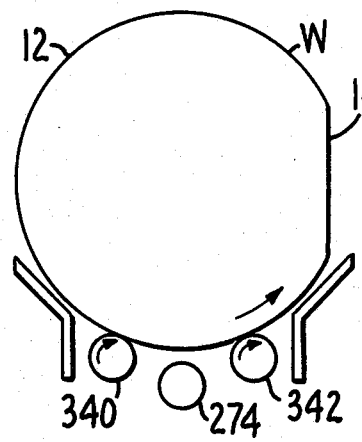
Figure 5F:
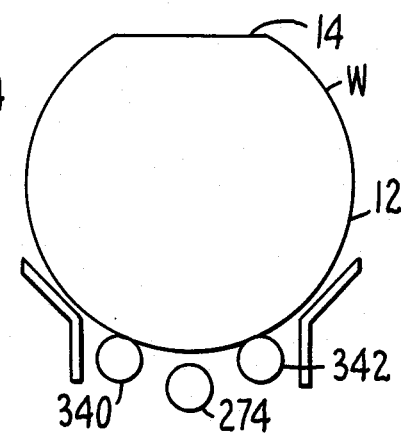

Rotation of roller 274 is continued until all wafers reach a position as shown in FIG. 5D in which all flat edges 14 lie in a common plane spaced apart from and out of driving contact with roller 274. Next, solenoid 288 is de-energized and spring 294 pulls roller 274 downward to the position shown in FIG. 5E. Then motor 354 is energized to drive rollers 340 and 342 in a clockwise direction. This causes rotation of wafers W in a counterclockwise direction, and because all wafers are subjected to identical rotational forces, all flat deges 14 remain in coplanar relationship. When the wafers reach the position shown in FIG. 5F, at which flat edges 14 reside at the top of tray T, motor 354 is de-energized so as to terminate rotation of wafers W. Thereafter, tray T can be removed from the apparatus for further processing which can be carried out expeditiously because all flat edges of the wafers reside in parallelism in an upward position.

Figure 6:
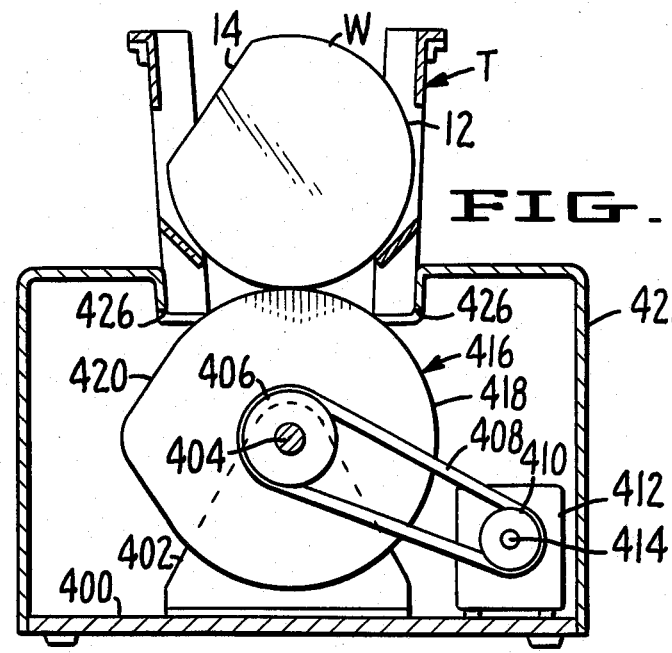
FIG. 6 is a partially schematic elevation view showing another embodiment of the invention.

An alternate embodiment of the invention is shown in partially schematic form in FIG. 6. There is a base plate 400 to which is fixed a pair of shaft support brackets, one of which is seen at 402. The brackets support a shaft 404 for rotation on a substantially horizontal axis. Fixed to shaft 404 is a sheave 406 around which is trained a drive belt 408. The opposite end of drive belt 408 is trained around a motor sheave 410 which is driven by motor 412 through a shaft 414.

Mounted on shaft 404 between bracket 402 and its counterpart (not shown) is a roller 416. Roller 416 has a friction surface composed of a cylindrical portion 418 and a protruding cam-like portion 420. The circumferential extent of cylindrical portion 418 is greater than the circumferential length of circular portion 12 of wafer W for reasons that will appear hereinafter. Secured to the periphery of base plate 400 is a housing 422 for having an upper surface in which is defined a platform 424 for supporting tray T thereon. The upper wall of housing 422 has an opening 426 so as to afford contact between the peripheral surfaces of the wafers and the surface of roller 416.

Figure 7A:
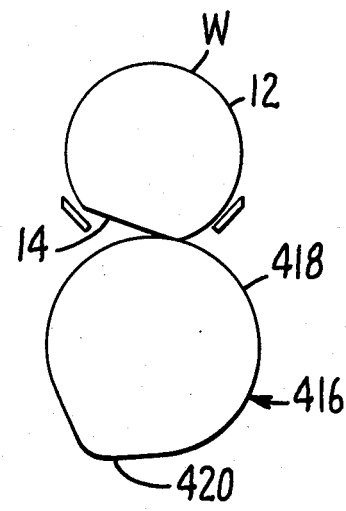
Figures 7B, 7C, 7D, 7E:
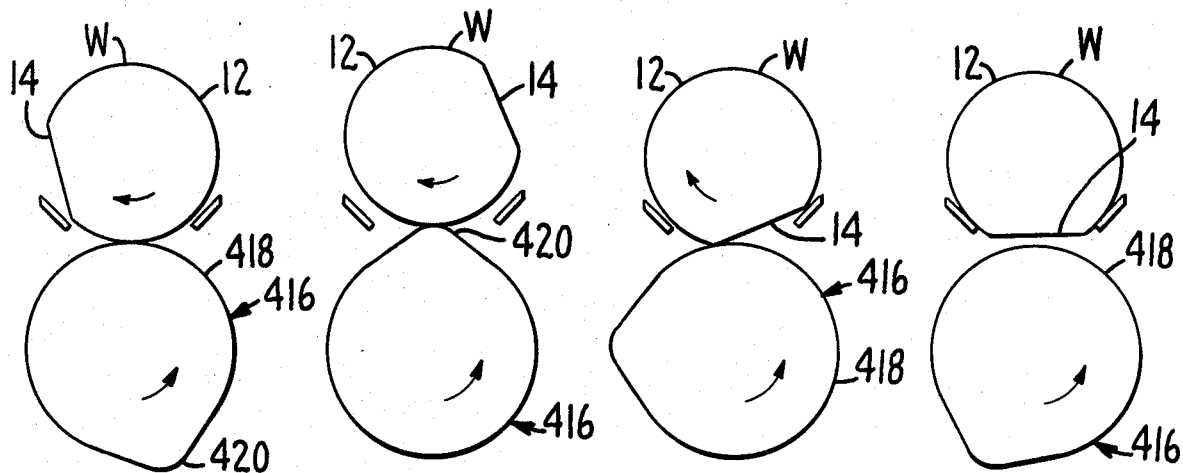
Figures 7F, 7G, 7H, 7I:
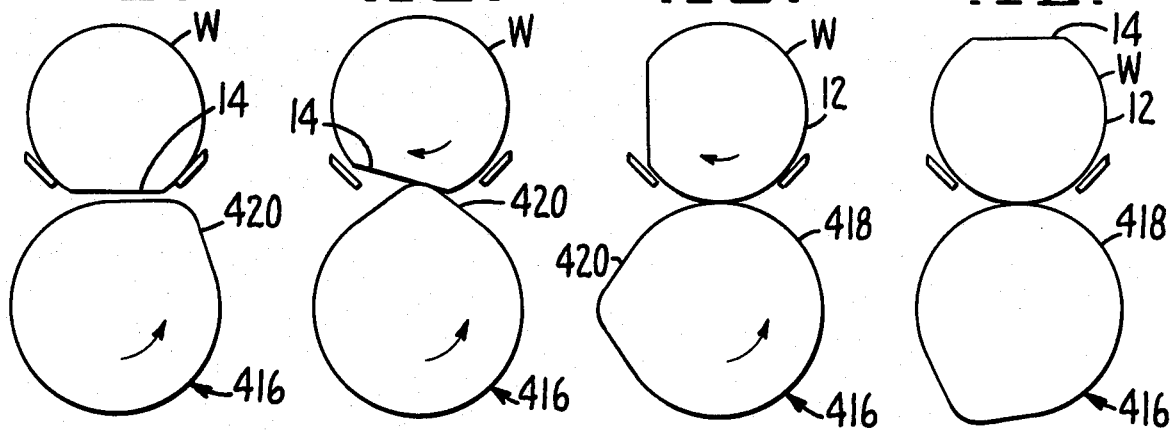

FIG. 7A represents a starting position for the apparatus of FIG. 6 at which cam-like portion 420 of roller 416 resides at about a 7 o'clock position and wafer W is in a worst case position. When motor 412 is activated to rotate roller 416 in a counterclockwise direction, wafer W is rotated in a clockwise direction as indicated in FIG. 7B, which represents a position of roller 416 approximately 60° from that shown in FIG. 7A. Continued rotation of roller 416 brings cam-like portion 420 to an upper position as shown in FIG. 7C. In such position wafer W is raised within wafer tray T but continues to rotate. FIG. 7D depicts a position of roller 416 after approximately 300° of rotation, and FIG. 7E shows the roller after a full 360° of rotation. At this point the flat edges 14 of all wafers W in tray T are at the lower part of the tray and reside in a common plane spaced apart from the circular portion 418 of the surface of roller 416. Wafers that are initially oriented in a position clockwise of that shown in FIG. 7A reach the flat edge down position of FIG. 7E earlier than the specific wafer shown in the latter figure. If it is desired that all wafers reside in tray T in the flat edge down position of FIG. 7E, rotation of roller 416 can be terminated and the tray can be removed. If, however, it is desired that the wafers reside in a flat edge up position within the tray, rotation of roller 416 is continued for another revolution. FIG. 7F depicts a condition at which roller 416 has rotated about 180° from the position shown in FIG. 7E. At such position protruding cam-like portion 420 is nearing contact with edges 14 of wafers W supported in tray T. Further rotation of roller 416 springs cam-like protrusion 420 into contact with flat edges 14 of the wafers, as seen in FIG. 7G, and the wafers are rotated. After cam-like projection has rotated away from the point of contact between roller 416 and wafer W, flat edge 14 has similarly rotated away from the point of contact so that circular portion 12 of wafer W contacts and is driven by circular portion 418 of the roller. See FIG. 7H. Further rotation of roller 416 brings flat edge 14 of all wafers W to the upward position as shown in FIG. 7. At this point power to motor 412 is interrupted and rotation of roller 416 terminates. Thus when tray T is removed from the apparatus, all wafers reside in position at which the flat edges 14 are in coplanar relation at the top of the wafer tray, the positions in FIG. 7I.

In all embodiments of the invention described previously, it is possible to orient wafers in either a flat edge down position or in a flat edge up position. In order to orient the wafers in a flat edge down position, operation of the roller is terminated at an earlier point in the sequence of operation. The elements in circuit module 110 can be such as to afford operator choice of the operating mode desired and can be such as to automate operation of the apparatus and thus not require operator attention other than loading a tray onto the apparatus and removing the tray when orientation has been completed. Although three embodiments of the invention have been shown and described, it will be obvious that other adaptations and modifications can be made without departing from the true spirit and scope of the invention.

What is claimed is:

1. Apparatus for orienting a plurality of planar wafers each of which has a periphery including a generally circular portion that is circular with respect to a central wafer axis, said periphery having a chordally extending flat side portion, the wafers being disposed in a wafer tray that has a plurality of parallel wafer-supporting slots and wafer supporting means engaging the periphery of each wafer for supporting each wafer in an individual slot with the central wafer axis of all wafers in coaxial aligment, the wafer tray having a truncated lower portion to afford access to the peripheries of the wafers therein, said orienting apparatus comprising a support platform for supporting the wafer tray in a position in which the wafers are substantially vertical and are gravitationally biased into said slots so that peripheries of said wafers depend below the truncated lower portion and are accessible beneath the wafer tray, a main roller having a central axis and a friction surface adapted for engaging the peripheries of said wafers, roller supporting means for supporting said main roller adjacent said platform so that said central axis is disposed substantially normal to said wafers and in vertical alignment below said wafer axis, said roller supporting means being adapted to position said roller friction surface in a first position relative to said platform at which said friction surface contacts the circular peripheral portion of said wafers and is spaced apart from said chordally extending flat portion, means for rotatively driving said main roller about said central axis in said first position to impart rotation to said wafers so that said main roller revolves said wafers for a sufficient arcuate length on the circular peripheral portion thereof that the flat side portions of all said wafers are rotated into substantial coplanar relation with one another and radially spaced apart from said roller friction surface at the lower portion of said wafer tray, means for effecting relative movement between said support platform and said roller supporting means to establish a second position at which said roller friction surface is nearer said central axis than in said first position so as to contact said chordally extending flat portions and afford rotation of said wafers in unison to a position at which the chordally extending flat side portions reside in mutually parallel relation at the top of said wafer tray, and means for resiliently biasing said roller supporting means in said first position.

2. Apparatus for orienting a plurality of planar wafers each of which has a periphery including a generally circular position and a chordally extending flat side portion, the wafers being disposed in a wafer tray that has a plurality of parallel wafer-supporting slots and wherein each wafer is supported in an individual slot, the wafer tray having a truncated lower portion to afford access to the peripheries of the wafers therein, said orienting apparatus comprising a support platform for supporting the wafer tray in a position in which the wafers are substantially vertical and are gravitationally biased into said slots so that peripheries of said wafers depend below the truncated lower portion and are accessible beneath the wafer tray, a main roller having a central axis and a friction surface adapted for engaging the peripheries of said wafers, roller supporting means for supporting said main roller adjacent said platform so that said central axis is disposed substantially normal to said wafers, said roller supporting means being adapted to position said roller friction surface in contact with the circular peripheral portion of said wafers, and means for rotatively driving said main roller about said central axis to impart rotation to said wafers so that said main roller revolves said wafers for a sufficient arcuate length on the circular peripheral portion thereof that the flat side portions of all said wafers are rotated into substantial coplanar relation with one another and radially spaced apart from said roller friction surface at the lower portion of said wafer tray, said apparatus also including first and second auxiliary rollers having high friction surfaces thereon, means for supporting said auxiliary rollers on fixed axes in flanking relation to said main roller and substantially parallel thereto, and motor means for rotatively driving said auxiliary rollers, said auxiliary rollers supporting said wafers when said main roller is translated away from said wafers, and means for controllably activating said motor means to rotate said wafers in unison to a position in which the flat edges thereof are upward in said tray.

3. Apparatus for orienting a plurality of planar wafers each of which has a periphery including a generally circular portion and a chordally extending flat side portion, the wafers being disposed in a wafer tray that has a plurality of parallel wafer-supporting slots and wherein each wafer is supported in an individual slot, the wafer tray having a truncated lower portion to afford access to the peripheries of the wafers therein, said orienting apparatus comprising a support platform for supporting the wafer tray in a position in which the wafers are substantially vertical and are gravitationally biased into said slots so that peripheries of said wafers depend below the truncated lower portion and are accessible beneath the wafer tray, a main roller having a central axis and a friction surface adapted for engaging the peripheries of said wafers, said main roller including a circular peripheral portion having a circumferential extent greater than the circumference of said wafers, said main roller also including a protruding cam portion having circumferential extremities tangent to said circular peripheral portion and an outward protruding extension intermediate the extremities, means for mounting said main roller below said support platform so that the circular portion thereof clears the flat sides of said wafers when the flat sides confront said main roller, said protruding extension protruding to an extent sufficient to engage said flat sides and rotate the wafers to a position at which the circular portions thereof engage the circular peripheral portion of said main roller, and means for rotating said roller through at least one revolution so that contact between the circular portions of said wafers and the circular peripheral portion of said roller rotates all wafers to a position at which the chordally extending side portions reside in coplanar relation adjacent the lower portion of said tray and so that contact between said chordally extending side portions and the protruding cam portions of said roller effects rotation of said wafers in unison to a position at which the chordally extending side portions reside in an upward position in said tray.

4. Apparatus for orienting a plurality of planar wafers each of which has a periphery including a generally circular portion and a chordally extending flat side portion, the wafers being disposed in a wafer tray that has a plurality of parallel wafer-supporting slots and wherein each wafer is supported in an individual slot, the wafer tray having a truncated lower portion to afford access to the peripheries of the wafers therein, said orienting apparatus comprising a base, a rigid frame secured to said base for pivotal movement about a substantially horizontal pivot axis, a shaft mounted for rotation on said frame in spaced relation to said pivot shaft and parallel thereto, a main roller secured to said shaft for rotation therewith and having a high friction cylindrical surface, a platform including means secured to said base and extending upward therefrom on opposite sides of said main roller so as to form a support for a wafer tray so that said main roller can contact the peripheries of wafers therein, means operatively connected to said base and to said frame for pivoting said frame about said pivot axis to move said main roller into and out of contact with wafer peripheries in a tray disposed on said platform, first driving means for controllably rotatively driving said main roller to rotate said wafers to a first position at which the flat sides thereof reside in substantial coplanar relation with one another and radially spaced from said roller at the bottom of said tray and second driving means for rotating said wafers in unison to a second position at which the flat edges of the wafers reside at the top of said wafer tray, said second driving means including first and second auxiliary rollers supported for rotation on opposite sides of said main roller, independent means for rotatively driving said auxiliary rollers in unison, said pivoting means operating to pivot said main roller and said frame downward when said flat edge portions are at the bottom of said tray to move said wafers into contact with said auxiliary rollers, means for activating said independent driving means to move the flat edge surfaces of said wafers to the upper part of said tray.

5. A method for orienting a plurality of generally circular wafers, each of which has a generally chordally extending flat side, into a position at which the flat sides of the wafers are substantially coplanar with one another comprising the steps of providing a wafer tray having a plurality of parallel wafer supporting slots, loading a plurality of wafers into the wafer tray so that each wafer is individually supported in one of the slots, positioning the wafer tray so that the wafers are gravitationally biased into the slots, providing a friction surface that has at least a portion that is cylindrical with respect to an axis, contacting the periphery of the wafers with the friction surface at a point below the tray in substantially vertical alignment with the center of the wafers, rotating the friction surface about the axis to revolve the wafers in unison, continuing the rotating step until the flat sides of all the wafers confront said friction surface in parallel with one another and in spaced apart relation to the friction surface, moving the friction surface relative to the tray to effect contact of the chordally extending flat sides and the friction surface, and rotating the friction surface to effect rotation of the wafers in unison until the flat sides reside at a position circumferentially spaced from the point of contact between the friction surface and the peripheries of the wafers.

6. Apparatus for rotationally orienting one or more disk-like elements, such as semiconductor wafers, arranged in generally spaced, coaxial relation in a cassette, the wafers having a circular exterior edge portion interrupted by a major flat edge portion, the cassette having a plurality of slots for engaging the edges of the wafers, with a portion of the cassette being open so that the edges of the wafers are accessible, the apparatus comprising:

an elongated roller driver extending generally parallel to the axis of the wafers adjacent the accessible edge of the wafers;

means for rotating the driver;

means for supporting the driver in a first position wherein the driver drivingly engages the circular edge of each of the wafers to rotate the wafers, the driver being spaced such that it does not rotate the wafers when the flat edges on the wafers are adjacent the driver, and means for changing the relative position between the driver and the cassette into a second position wherein the driver drivingly engages the flat edges on the wafers to rotate the wafers and continues to rotate the wafers when the driver engages the circular edge of each of the wafers so that the wafers may be rotated a predetermined desired amount in the second position to obtain the desired rotational orientation of the wafers.

7. The method of angularly orienting one or more disk-like wafers having a primarily circular edge interrupted by a flat-edge portion, the wafers being supported in a holder in a manner to make the edges accessible, comprising:

positioning a generally cylindrical driver adjacent the holder with the driver being positioned in driving engagement with the circular edges of the wafers;

rotating the driver so as to rotate the wafers to a position wherein the flat-edged portion of each of the wafers is facing the driver, the driver being initially positioned so it cannot rotate the wafers when the flat portion is facing the driver;

changing the relative position between the driver and the holder to a second position so that after the flat edges are all aligned the driver will drivingly engage the flat edge portions on the wafers and once more cause the wafers to rotate; and interrupting the rotation of the driver in the second position after the wafers have been rotated to a desired aligned orientation of the flat edge portions.

* * * * *